(12) United States Patent
Hinnen et al.

(10) Patent No.: US 7,573,574 B2
(45) Date of Patent: Aug. 11, 2009

(54) LITHOGRAPHIC APPARATUS AND DEVICE MANUFACTURING METHOD

(75) Inventors: Paul Christiaan Hinnen, Veldhoven (NL); Richard Johannes Franciscus Van Haren, Waalre (NL); Hubertus Johannes Gertrudus Simons, Venlo (NL)

(73) Assignee: ASML Netherlands BV, Veldhoven (NL)

( * ) Notice: Subject to any disclaimer, the term of this patent is extended or adjusted under 35 U.S.C. 154(b) by 739 days.

(21) Appl. No.: 10/889,211

(22) Filed: Jul. 13, 2004

(65) Prior Publication Data

US 2006/0012763 A1  Jan. 19, 2006

(51) Int. Cl.
*G01B 11/00* (2006.01)
*G01B 11/14* (2006.01)
*G03F 9/00* (2006.01)
*G03C 5/00* (2006.01)
*G03B 27/42* (2006.01)

(52) U.S. Cl. .................. 356/401; 356/620; 355/53; 430/22; 430/30

(58) Field of Classification Search .................. None
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,627,624 A * | 5/1997 | Yim et al. ............. | 355/53 |
| 5,656,182 A | 8/1997 | Marchman et al. | |
| 5,677,703 A | 10/1997 | Bhuva et al. | |
| 5,808,797 A | 9/1998 | Bloom et al. | |

(Continued)

FOREIGN PATENT DOCUMENTS

EP  1 482 375 A2  12/2004

(Continued)

OTHER PUBLICATIONS

English Abstract of Japanese Patent Pub. 2-278812, published Nov. 15, 1990, 1 pg.

(Continued)

*Primary Examiner*—Gregory J Toatley, Jr.
*Assistant Examiner*—Gordon J Stock, Jr.
(74) *Attorney, Agent, or Firm*—Sterne, Kessler, Goldstein & Fox P.L.L.C.

(57) ABSTRACT

A lithographic apparatus and method comprise an illumination system arranged to provide a radiation beam, a support structure configured to support a product patterning device and a metrology target patterning device. The product patterning device imparts a radiation beam derived from the illumination system with a product pattern in its cross-section representing features of a product device to be formed. The metrology target patterning device imparts the radiation beam with a metrology target pattern in its cross-section representing at least one metrology target. The product patterning device is separate from the metrology target patterning device. A substrate table holds a substrate. A projection system project the radiation patterned by the product patterning device and the metrology target patterning device onto a target portion of the substrate. A metrology target patterning device controller adjusts the metrology target pattern independently of the product pattern.

18 Claims, 11 Drawing Sheets

U.S. PATENT DOCUMENTS

| | | |
|---|---|---|
| 5,982,553 A | 11/1999 | Bloom et al. |
| 6,133,986 A | 10/2000 | Johnson |
| 6,177,980 B1 | 1/2001 | Johnson |
| 6,239,858 B1 * | 5/2001 | Tomimatu ................. 355/18 |
| 6,251,550 B1 * | 6/2001 | Ishikawa ................. 430/22 |
| 6,473,157 B2 * | 10/2002 | Nakahara ................. 355/53 |
| 6,687,041 B1 | 2/2004 | Sandstrom |
| 6,732,004 B2 * | 5/2004 | Mos et al. ................. 700/114 |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,832,045 B2 * | 12/2004 | Nakaya et al. ............. 396/548 |
| 6,869,739 B1 | 3/2005 | Ausschnitt et al. |
| 6,936,385 B2 * | 8/2005 | Lof et al. ................. 430/22 |
| 6,937,318 B2 * | 8/2005 | Van De Nieuwelaar ....... 355/53 |
| 7,049,049 B2 * | 5/2006 | Fries ................. 430/311 |
| 7,075,639 B2 * | 7/2006 | Adel et al. ............. 356/237.5 |
| 7,130,049 B2 * | 10/2006 | Consolini et al. ........... 356/399 |
| 2004/0013954 A1 * | 1/2004 | Gijsbertsen et al. .......... 430/22 |
| 2004/0041104 A1 | 3/2004 | Liebregts et al. |
| 2004/0119970 A1 * | 6/2004 | Dusa et al. ............... 356/237.1 |
| 2004/0130561 A1 | 7/2004 | Jain |
| 2005/0001572 A1 | 1/2005 | Benchaib et al. |
| 2005/0105071 A1 * | 5/2005 | Ishii ............................ 355/53 |
| 2005/0213806 A1 * | 9/2005 | Hanina et al. ............... 382/151 |
| 2006/0012779 A1 | 1/2006 | Hinnen et al. |

FOREIGN PATENT DOCUMENTS

| | | |
|---|---|---|
| JP | 2-278812 A | 11/1990 |
| WO | WO 98/33096 | 7/1998 |
| WO | WO 98/38597 | 9/1998 |

OTHER PUBLICATIONS

Office Action, Japanese Patent Appln. 2005-202636, mailed Oct. 7, 2008, 3 pgs.

* cited by examiner

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means may comprise an array of individually controllable elements that generate the circuit pattern. For example, the patterning means can be, but is not limited to, a reflective or transmissive contrast device, such as a spatial light modulator, a digital mirror device, a grating light valve, a liquid crystal display, or the like.

In general, a single substrate will contain a network of adjacent target portions that are successively exposed. Known lithographic apparatus include steppers, in which each target portion is irradiated by exposing a pattern onto the target portion in each exposure period. Other known lithographic apparatus include scanners, in which each target portion is irradiated by scanning the pattern through the projection beam in a given direction (the "scanning" direction), while synchronously scanning the substrate parallel or anti-parallel to this direction.

A metrology target generally refers to a type of target that may form part of the pattern written to the substrate, but which does not actually contribute directly to the functional or structural form of the device being manufactured. Usually, the function of a metrology target is to facilitate aspects of the manufacturing process itself, such as alignment of a substrate to the projection system, verification of overlay and/or imaging properties, etc. Metrology targets may therefore include alignment marks and targets used in "offline" metrology equipment associate with or within the lithography apparatus. Offline generally refers to metrology equipment designed to process a substrate separately from, and at a different time to, the main lithography processes used to pattern the substrate, while inline metrology refers to processes carried out at the same time and/or position. For the purposes of this description, protective structures for the above alignment marks and targets are themselves to be understood as types of metrology target.

In one example using mask-based systems, the metrology targets normally have to be defined before the mask is actually made. If it turns out that in manufacturing conditions the metrology target design is non-optimal, e.g., for overlay performance, a new mask or set of masks has to be produced before an improved metrology target design can be implemented. This hampers the speed at which the potential of new metrology target designs can be evaluated and leads to increased costs for the customer.

Therefore, what is needed is a system and method that can optimize performance of metrology targets in lithographic devices. Additionally or alternatively, what is needed is a system and a method that can add flexibility in the choice of metrology target even after the product design has been finalized.

SUMMARY OF THE INVENTION

One embodiment of the present invention provides a lithographic apparatus comprising an illumination system arranged to provide a radiation beam, a support structure configured to support a product patterning device, and a metrology target patterning device. The product patterning device is capable of imparting a radiation beam derived from the illumination system with a product pattern in its cross-section representing features of a product device to be formed. The metrology target patterning device is capable of imparting a radiation beam derived from the illumination system with a metrology target pattern in its cross-section representing at least one metrology target. The product patterning device is separate from the metrology target patterning device. The lithographic apparatus also comprises a substrate table configured to hold a substrate, a projection system arranged to project the radiation patterned by the product patterning device and the metrology target patterning device onto a target portion of the substrate, and a metrology target patterning device controller that is capable of adjusting the metrology target pattern independently of the product pattern.

In this embodiment, having an independent device for controlling the metrology target pattern makes it possible to update the metrology target without changing the product pattern. This arrangement makes it possible to change frequently the metrology target pattern, location, etc., without replacing or altering the product pattern, which may be embodied in an expensive reticle set or a large data set in maskless lithography systems. In various examples, metrology target design changes may be triggered by: 1) inline metrology considerations; 2) offline metrology considerations; and/or 3) new insights from metrology target design projects.

In one example, the metrology target patterning device controller can be arranged to adjust the metrology target pattern after the product pattern has been finalized. This "last minute" addition of the metrology target pattern, just before exposure, greatly increases the scope for efficient metrology target optimization, including inline or "real time" optimization. Optimization may be achieved via a feedback loop, e.g., taking data from an inspection of patterned and processed substrates. More generally, this feature adds choice and flexibility for the printing and positioning of metrology targets.

In one example, at least one of the product patterning device and the metrology target patterning device may comprise an array of individually controllable elements. The use of such arrays for the metrology target pattern, for example, provides increased flexibility and increased update speed when compared with a conventional reflective or transmissive mask. It is often difficult to predict in advance how well a given metrology target (and in particular the substructure associated with a metrology target) will perform. Following a change in the overall metrology target design, therefore, it is frequently necessary to fine-tune parameters of a new metrology target in order to optimize its performance. According to one example of the present embodiment, this is made possible without having to create a new mask each time.

In one example, an array of individually controllable elements serving the same purpose has the advantage of always being fixed in one position, in contrast to a plurality of metrology target patterns embodied in a set of different masks. This example of the present invention may therefore achieve greater accuracy than the set of masks, where masks have to be physically moved in and out of position every time the metrology target pattern is to be changed.

In one example, the product patterning device and/or the metrology target patterning device may also comprise a mask. To accommodate such a feature, the lithographic apparatus may further comprise a mask storage device, capable of storing a plurality of masks, and a mask storage device controller, adapted to transfer a selected mask from the mask storage device to an imaging position in the lithography device. Masks offer several advantages over an array of individually controllable elements and may be more suitable in certain circumstances. For example, due to the relative simplicity of the metrology target pattern in comparison to the product target pattern, it may not be justified to dedicate a relatively expensive array of individually controllable elements with complex control requirements to the metrology target pattern where a relatively simple, inter-changeable metrology target reticle set may suffice. In one example, the throughput rate may be higher with masks, particularly where a fixed mask is used in the product patterning device.

In one example, the metrology target patterning device controller may be arranged to adjust the metrology target based on information derived from inspection of a previously imaged substrate. This feedforward step can be incorporated into a loop in order to provide for efficient updating of metrology targets.

In one example, the apparatus may further comprise a metrology target inspection device capable of inspecting a metrology target on a substrate and automatically providing the results of the inspection to the metrology target patterning device controller. The metrology target patterning device controller may then print a new substrate, which is subsequently inspected in order to further refine the metrology target. The inspection step will normally be carried out outside of the main projection beam path as it is generally necessary to process the metrology target patterned substrates prior to inspection.

In various examples, the optimization process described above may address a number of features of metrology target design. These may include primary structures, substructures and metrology target segmentation. The latter can include alignment mark segmentation, where segmentation along the scan direction is used to generate different diffraction orders that will enhance the signal strength of specific orders to be used for alignment, and process segmentation, where the metrology target is segmented parallel or perpendicular to the scan direction but with segmentation dimensions not related to valid alignment orders. This will not influence the diffraction orders generated but might make the mark compatible with process and design rules.

In one example, the metrology target patterning device controller maybe arranged to provide a metrology target pattern comprising a plurality of metrology targets. In the case where metrology targets are being tested for optimization purposes, a number of metrology targets can be imaged onto each substrate to allow a plurality of tests to be made for each exposed substrate. In this example, the metrology target inspection device discussed above may be arranged to test each of a plurality of metrology targets on the first substrate before sending its control signal to the metrology target patterning device controller in order to improve the metrology target pattern to be applied to the new substrate.

In one example, Two or more of the metrology targets may be positioned in different target portions on the substrate. This approach provides greater scope for positioning multiple metrology targets. In many cases, the optimal position for a certain type of metrology target will be different from other metrology targets. For example, this may be the case for coarse and fine alignment marks.

In one example, different metrology targets are written into different dies. This approach generally reduces the amount of space that needs to be reserved for metrology targets on each die, thereby leaving more room available to the customer to arrange product device features. For example, for the coarse and fine alignment marks mentioned above, if it were not possible to change the metrology target design each exposure (and therefore from die to die), each exposure would have to contain two marks for coarse and fine alignment, which is a waste of space. In designs involving a mask containing both the product pattern and the metrology target pattern, such variation from die to die would not be possible without frequent exchange of the entire mask.

In one example, the metrology target patterning device controller maybe capable of providing metrology targets corresponding to the standards of different manufacturers. This feature allows users to easily print individual layers with machines from different manufacturers. In the absence of this feature, this might only be achieved by creating brand new masks with new metrology targets and this feature avoids the expense and loss of time associated with such steps.

In one example, it is convenient to use metrology targets that are much larger than individual product features. However, these may be imaged slightly differently by the projection apparatus, leading to a mismatch between the metrology targets and product features. Errors arising in this way may be reduced by including a substructure in the metrology target pattern. The substructure may be given a form different to that of the primary structure, for example a form that more resembles product features. In particular, the substructure may be arranged with a characteristic length scale much smaller than that of the primary structure. In addition to product-like features, the substructure may include contact holes and horizontal or vertical lines.

The embodiments and examples of the invention discussed above provide for highly efficient optimization of the type and parameters of these substructures, including the possibility to test over a broader range of parameters than would be possible with prior art schemes.

In one example, the metrology target patterning device maybe arranged to impart the radiation beam with a pattern corresponding to a metrology target and a pattern corresponding to a protective structure for the metrology target. Protective structures prevent excessive mechanical and/or chemical attack from external sources (such as during substrate polishing phases), which may degrade the quality of a metrology target, and therefore induce overlay measurement errors.

In one example, a certain clearance from surrounding features may be desired. However, if the metrology target is too exposed (e.g., to mechanical or chemical attack, as discussed above), it is likely to be vulnerable. Smaller metrology targets risk being exposed (e.g., with radiation) even when they are positioned in the scribe lane between individual dies (this region represents the lane along which the substrate will eventually be cut to separate completed dies) as their spatial extent may be small in comparison to the width of the scribe lane. In other examples, this may not be the case with certain types of larger metrology target (e.g., alignment marks). In examples where metrology targets are positioned around the edge of the substrate outside the dies, most types of metrology target will benefit from some form of protective structure. The provision of such structures increases the effective space available to position metrology targets.

In one example, the protective structures may comprise multiple copies of a metrology target, arranged at an optimal separation from the functional target and from each other. Other dummy structures may also be used, a general aim being to provide a more uniformly patterned surface. Which structures work the best in practice is difficult to predict, thus a number of trials may be desirable to determine an optimum size and shape.

In various examples, cross-talk may occur between the product patterning device and the metrology target patterning device, or between elements of the radiation beam patterned thereby, or between metrology target structures and device structures on the substrate itself. This may be reduced by positioning the metrology targets in the scribe lane of the substrate in a position where no cross-talk is anticipated or where cross-talk is minimized (this may be deduced from a knowledge of the product pattern to be printed). For example, cross-talk with a metrology target of a certain type of structure might in general be minimized by positioning the metrology target away from similar structures in the product device pattern.

Another embodiment of the present invention provides a lithographic apparatus comprising an illumination system adapted to supply a projection beam of radiation, a control system configured to control an array of individually controllable elements serving to impart the projection beam with a pattern in its cross-section, thus providing a patterned radiation beam, a substrate table configured to hold a substrate, and a projection system arranged to project the patterned radiation beam onto a target portion of the substrate. The control system is adapted to receive: a first data file comprising product pattern data representing features of a product device to be formed and a second data file comprising metrology target data representing at least one of an intended metrology target pattern and an intended metrology target location on the substrate.

This embodiment makes it possible quickly and efficiently to add or change the metrology target pattern to be printed onto the substrate.

In one example, the metrology target pattern maybe controlled independent of the product pattern and be altered at a much later stage than would otherwise be possible. In fact, this embodiment allows the metrology target to be changed after the product pattern itself has been finalized and may be left as a final process to be carried out just before the substrate is actually exposed.

In one example, the lithographic apparatus may further comprise a metrology target verification and adaptation device, capable of determining the likely performance of a metrology target based on an analysis of the product pattern data and the metrology target pattern data, and, according to the likely performance thus determined, providing an updated metrology target data to the control system. This embodiment allows for new metrology marks as it makes it possible to adjust automatically the metrology target pattern and position to an optimum state without a user having to manually analyze details of the product structure beforehand. Metrology targets may therefore be changed rapidly without great expense. The metrology target verification and adaptation device may be arranged to operate in real time so that new metrology targets may be introduced inline.

A further embodiment of the present invention provides a metrology target optimizing method, comprising the steps of providing a radiation beam using an illumination system, using a product patterning device to impart a radiation beam derived from the illumination system with a product pattern in its cross-section representing features of a product device to be formed, using a metrology target patterning device to impart a radiation beam derived from the illumination system with a metrology target pattern in its cross-section representing at least one metrology target, projecting the radiation patterned by the product patterning device and the metrology target patterning device onto a target portion of a substrate, inspecting the metrology target pattern generated on the substrate after developing and processing, and updating control data to be sent to the metrology target patterning device, based on the inspection.

A still further embodiment of the present invention provides a device manufacturing method comprising the steps of providing a radiation beam using an illumination system, using a product patterning device to impart a radiation beam derived from the illumination system with a product pattern in its cross-section representing features of a product device to be formed, using a metrology target patterning device to impart a radiation beam derived from the illumination system with a metrology target pattern in its cross-section representing at least one metrology target, projecting the radiation patterned by the product patterning device and the metrology target patterning device onto a target portion of a substrate, controlling the metrology target patterning device separately from the product patterning device so as to be able independently to change the at least one metrology target without changing the product pattern.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE EMBODIMENTS

Overview and Terminology

Figure 1:
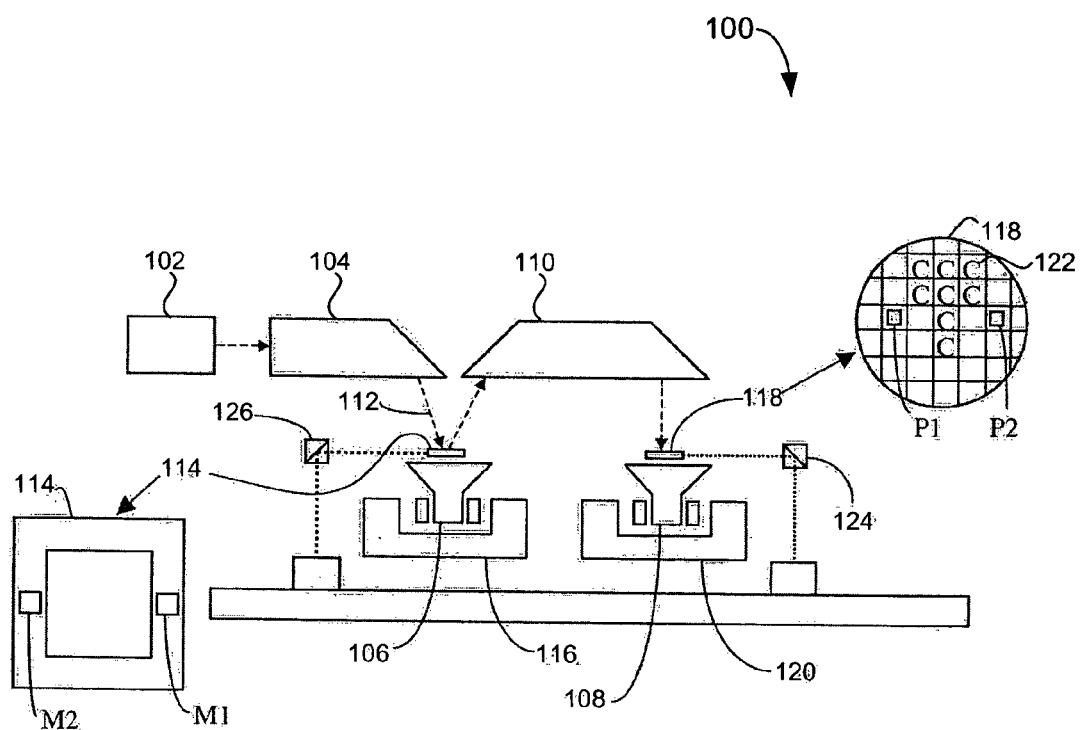
FIG. 1 depicts a lithographic apparatus, according to one embodiment of the invention.

Although specific reference may be made in this text to the use of lithographic apparatus in the manufacture of integrated circuits (ICs), it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein maybe applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system."

The term "patterning means" used herein should be broadly interpreted as referring to means that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

Patterning means may be transmissive or reflective. Examples of patterning means include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning means, the support structure may be a frame or table, for example, which may be fixed or movable as required and which may ensure that the patterning means is at a desired position, for example with respect to the projection system. Any use of the terms "reticle" or "mask" herein may be considered synonymous with the more general term "patterning means".

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (e.g., dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index (e.g., water), so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Further, the apparatus may be provided with a fluid processing cell to allow interactions between a fluid and irradiated parts of the substrate (e.g., to selectively attach chemicals to the substrate or to selectively modify the surface structure of the substrate).

Exemplary Lithography System

FIG. 1 schematically depicts a lithographic apparatus 100, according to one particular embodiment of the invention. Lithographic apparatus comprises a radiation source 102, an illumination system 104, a first support structure 106, a substrate table 108, and a projection system 110.

Illumination system 104 (e.g., an illuminator) provides a radiation beam 112 comprising, for example, ultra violet (UV) or extreme ultra violet (EUV) radiation. Illuminator 104 receives a radiation beam from radiation source 102.

First support structure 106 (e.g. a mask table) supports a patterning means 114 (e.g. a mask) and is connected to a first positioning means 116 for accurately positioning patterning means 114 with respect to projection system 110.

Substrate table 108 (e.g. a wafer table) holds a substrate 118 (e.g. a resist-coated wafer) and is connected to a second positioning means 120 that accurately positions substrate 118 with respect projection system 110.

Projection system 110 (e.g. a reflective projection lens) images a pattern imparted to radiation beam 112 via patterning means 114 onto a target portion 122 (C) (e.g. one or more dies) of substrate 118.

In this embodiment, lithographic apparatus 100 is of a reflective type (e.g., employing a reflective mask or a programmable mirror array of a type as referred to above). Alternatively, lithographic apparatus 100 may be of a transmissive type (e.g., employing a transmissive mask).

In one embodiment, source 102 and lithographic apparatus 100 may be separate entities. For example, when source 102 is a plasma discharge source. In such cases, source 102 is not considered to form part of lithographic apparatus 100, and radiation beam 112 is generally passed from source 102 to illuminator 104 with the aid of a radiation collector (not shown). The radiation collector can comprise, for example, but not limited to, suitable collecting mirrors and/or a spectral purity filter.

In other cases source 102 may be integral part of apparatus 100. For example, when source 102 is a mercury lamp.

In one example, source 102 and illuminator 104 may be referred to as a radiation system.

Illuminator 104 may comprise adjusting means (not shown) that adjust an angular intensity distribution of beam 112. Generally, at least the outer and/or inner radial extent (commonly referred to as σ-outer and σ-inner, respectively) of the intensity distribution in a pupil plane of illuminator 102 can be adjusted. Illuminator 102 provides a conditioned beam of radiation, referred to as radiation beam 112, having a desired uniformity and intensity distribution in its cross-section.

Radiation beam 112 is incident on mask 114, which is held on mask table 106. Being reflected by mask 114, radiation beam 112 passes through projection system 110, which focuses the beam onto target portion C of substrate 118. With the aid of second positioning means 120 and a position sensor 124 (e.g. an interferometric device), substrate table 108 can be moved accurately, e.g. so as to position different target portions C in the path of beam 112. Similarly, first positioning means 116 and a position sensor 126 can be used to accurately position mask 114 with respect to the path of beam 112, e.g. after mechanical retrieval from a mask library, or during a scan. In general, movement of object tables 106 and 108 will be realized with the aid of a long-stroke module (coarse positioning) (not shown) and a short-stroke module (fine positioning) (not shown), which form part of positioning means 116 and 120. However, in the case of a stepper (as opposed to a scanner) mask table 116 may be connected to a short stroke actuator only, or may be fixed. Mask 114 and substrate 118 may be aligned using mask alignment marks M1, M2 and substrate alignment marks P1, P2, respectively.

In various example, apparatus 100 can be used step, scan, or other modes, examples of which are described below, but are not to be seen as an exhaustive list.

In step mode, mask table 106 and substrate table 108 are kept essentially stationary, while an entire pattern imparted to radiation beam 112 is projected onto a target portion C in one go (i.e., a single static exposure). Substrate table 108 is then shifted in the X and/or Y direction so that a different target portion C can be exposed. In step mode, a maximum size of the exposure field limits the size of the target portion C imaged in a single static exposure.

In scan mode, mask table 106 and substrate table 108 are scanned synchronously, while a pattern imparted to radiation beam 112 is projected onto a target portion C (i.e., a single dynamic exposure). A velocity and direction of substrate table 108 relative to mask table 106 is determined by (de-) magnification and image reversal characteristics of projection system 110. In scan mode, a maximum size of an exposure field limits a width (in the non-scanning direction) of target portion C in a single dynamic exposure, whereas a length of the scanning motion determines a height (in the scanning direction) of target portion C.

In another mode, mask table 106 is kept essentially stationary holding a programmable patterning means, and substrate table 108 is moved or scanned, while a pattern imparted to radiation beam 112 is projected onto target portion C. In this mode, generally a pulsed radiation source 102 is employed and patterning means 114 is updated as required after each movement of substrate table 108 or in between successive radiation pulses during a scan. This mode of operation can be readily applied to maskless lithography that utilizes a programmable patterning means for patterning means 114, for example, but not limited to, a programmable mirror array of a type as referred to above.

Combinations and/or variations on the above described modes of use or entirely different modes of use may also be employed.

Exemplary Product and Target Patterning Means Arrangements

Figure 2A:
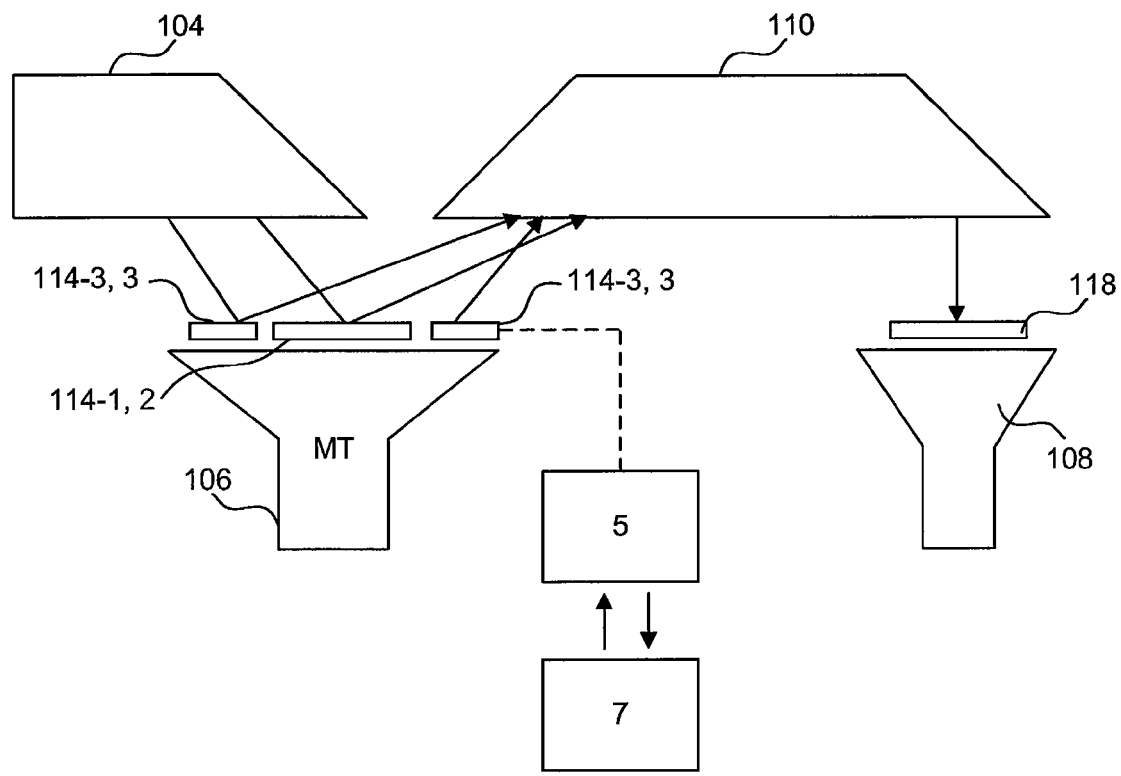
FIG. 2a depicts a lithographic apparatus comprising a first exemplary arrangement of a product patterning device and a metrology target patterning according to one embodiment of the invention.
Figure 2B:
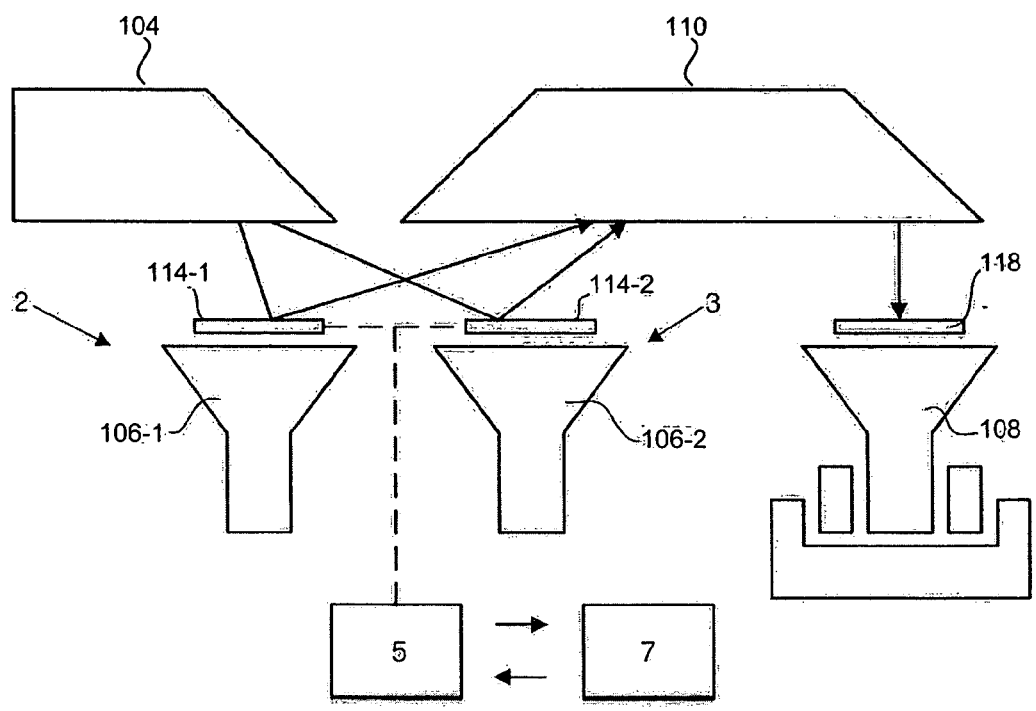
FIG. 2b depicts a lithographic apparatus comprising a second exemplary arrangement of a product patterning device and a metrology target patterning, according to one embodiment of the invention.

FIGS. 2a and 2b are close-up views of a lithographic apparatus 100 in a region of one or more mask tables 106, according to one embodiment of the invention. Two alternative arrangements are shown in which lithographic apparatus 100 comprises a product patterning device 2, for example a mask, and a metrology target patterning device 3, for example a mask.

In one exemplary arrangement, shown in FIG. 2a, mask table 106 is configured to support a product patterning mask 114-1 and one or more metrology target patterning masks 114-3.

In one exemplary arrangement, shown in FIG. 2b, two mask tables 106-1 and 106-2 are used. Mask table 106-1 supports product patterning mask 114-1 and mask table 106-2 supports metrology target patterning mask 114-2.

The patterning masks 114-1, 114-2, and 114-3 are arranged to impart a pattern in the cross-section of radiation beam 112 generated by illumination system 104.

Although a single radiation source 102 is illustrated in FIG. 1, illumination system 104 may comprise a plurality of radiation sources 102. For example, this can be done to provide initially separate radiation beams 112 to be patterned by product patterning mask 114-1 and metrology target patterning mask 114-2/114-3. In one example using product patterning mask 114-1, this will correspond to functional or structural features in a layer of the product being manufactured, whereas for target patterning masks 114-2 and 114-3, the pattern will correspond to metrology targets. For example, metrology targets can be, but are not limited to, alignment marks to align one patterned layer on substrate 118 with another, to align substrate 118 itself relative to projection system 110, or for other functions.

In each of the arrangements shown in FIGS. 2a and 2b, the metrology target patterning mask(s) 114-2 and 114-3 may be operated (e.g., exchanged, etc.) independently from product patterning mask 114-1. This arrangement allows for development of the metrology target design in product-like circumstances (i.e., during one of the normal stages of product manufacture) rather than in a separate procedure dedicated solely to metrology target improvement. In each case, they may interact with a mask storage device controller 5, which executes mask exchange with a mask storage device 7.

Second Exemplary Lithography Apparatus

Figure 3:
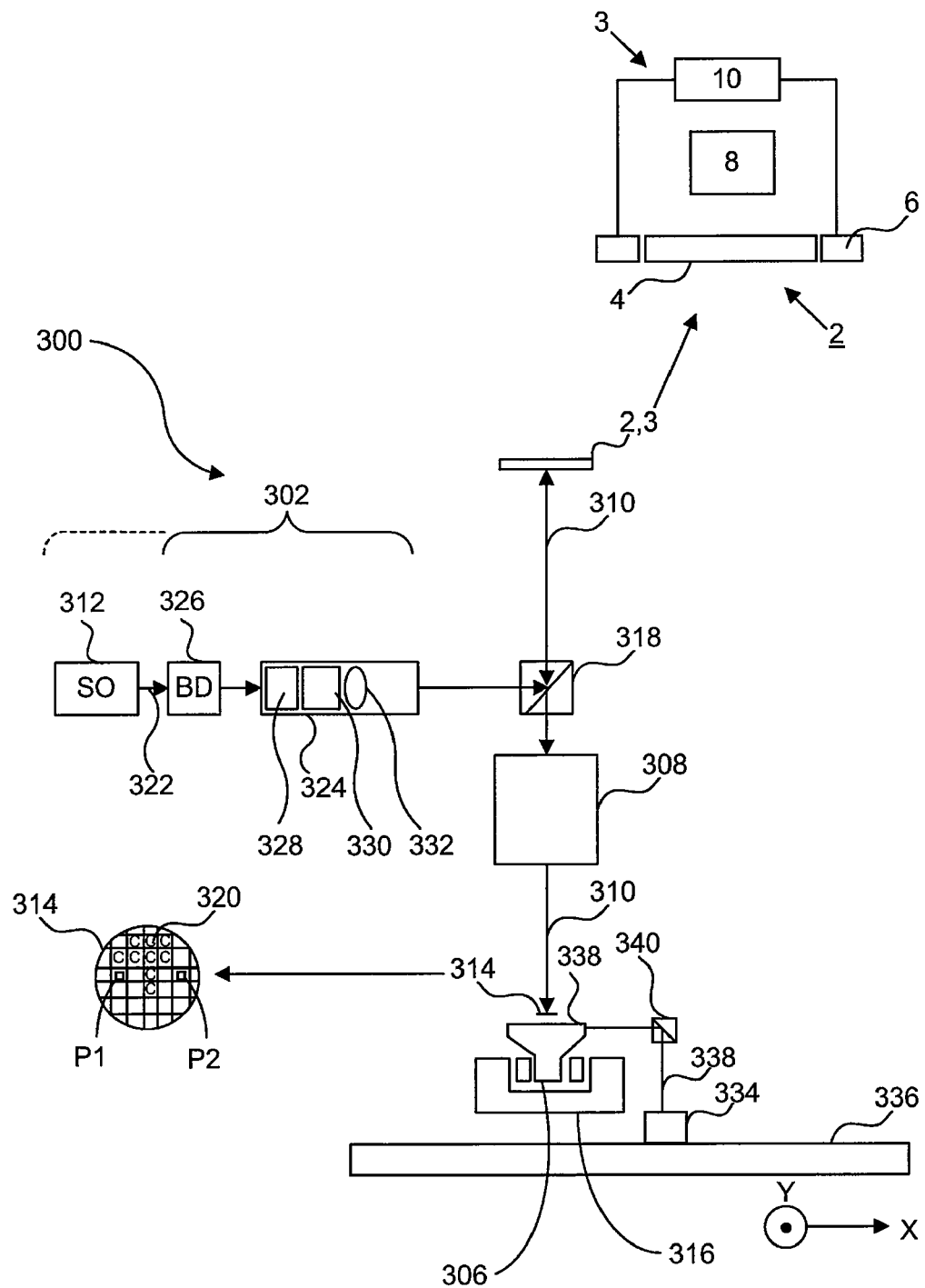
FIG. 3 depicts an alternative configuration of a lithographic, according to one embodiment of the invention, where the metrology target patterning device comprises an array of individually controllable elements.

FIG. 3 schematically depicts a lithographic projection apparatus 100 according to an embodiment of the invention. In this embodiment, patterning devices 2 and 3 comprises an array of individually controllable elements 6 (e.g., a programmable mirror array, a grating light valve, a liquid crystal display, a digital mirror device, or the light contrast device or pattern generator) for applying a pattern to radiation beam 310.

Apparatus 300 includes at least a radiation system 302, patterning devices 2 and 3, an object table 306 (e.g., a substrate table), and a projection system ("lens") 308.

Radiation system 302 can be used for supplying a projection beam 310 of radiation (e.g., UV radiation), which in this particular case also comprises a radiation source 312.

An array of patterning devices 2 and 3 (e.g., a programmable mirror array) can be used for applying a pattern to projection beam 310. In general, the position of the array of patterning devices 2 and 3 can be fixed relative to projection system 308. However, in an alternative arrangement, an array of patterning devices 2 and 3 may be connected to a positioning device (not shown) for accurately positioning it with respect to projection system 308. As here depicted, patterning devices 2 and 3 are of a reflective type (e.g., have a reflective array of individually controllable elements).

Object table 306 can be provided with a substrate holder (not specifically shown) for holding a substrate 314 (e.g., a resist coated silicon wafer or glass substrate) and object table 306 can be connected to a positioning device 316 for accurately positioning substrate 314 with respect to projection system 308.

Projection system 308 (e.g., a quartz and/or CaF2 lens system or a catadioptric system comprising lens elements made from such materials, or a mirror system) can be used for projecting the patterned beam received from a beam splitter 318 onto a target portion 320 (e.g., one or more dies) of substrate 314. Projection system 308 may project an image of the array of patterning devices 2 and 3 onto substrate 314. Alternatively, projection system 308 may project images of secondary sources for which the elements of the array of patterning devices 2 and 3 act as shutters. Projection system 308 may also comprise a micro lens array (MLA) to form the secondary sources and to project microspots onto substrate 314.

Source 312 (e.g., an excimer laser) can produce a beam of radiation 322. Beam 322 is fed into an illumination system (illuminator) 324, either directly or after having traversed conditioning device 326, such as a beam expander 326, for example. Illuminator 324 may comprise an adjusting device 328 for setting the outer and/or inner radial extent (commonly referred to as R-outer and w-inner, respectively) of the intensity distribution in beam 322. In addition, illuminator 324 will generally include various other components, such as an integrator 330 and a condenser 332. In this way, projection beam 310 impinging on the array of patterning devices 2 and 3 has a desired uniformity and intensity distribution in its cross section.

It should be noted, with regard to FIG. 3, that source 312 may be within the housing of lithographic projection apparatus 300 (as is often the case when source 312 is a mercury lamp, for example). In alternative embodiments, source 312 may also be remote from lithographic projection apparatus 300. In this case, radiation beam 322 would be directed into apparatus 300 (e.g., with the aid of suitable directing mirrors). This latter scenario is often the case when source 312 is an excimer laser. It is to be appreciated that both of these scenarios are contemplated within the scope of the present invention.

Beam 310 subsequently intercepts the array of patterning devices 2 and 3 after being directing using beam splitter 318. Having been reflected by the array of patterning devices 2 and 3, beam 310 passes through projection system 308, which focuses beam 310 onto a target portion 320 of the substrate 314.

With the aid of positioning device 316 (and optionally interferometric measuring device 334 on a base plate 336 that receives interferometric beams 338 via beam splitter 340), substrate table 306 can be moved accurately, so as to position different target portions 320 in the path of beam 310. Where used, the positioning device for the array of patterning devices 2 and 3 can be used to accurately correct the position of the array of patterning devices 2 and 3 with respect to the path of beam 310, e.g., during a scan. In general, movement of object table 306 is realized with the aid of a long-stroke module (course positioning) and a short-stroke module (fine positioning), which are not explicitly depicted in FIG. 3. A similar system may also be used to position the array of patterning devices 2 and 3. It will be appreciated that projection beam 310 may alternatively/additionally be moveable, while object table 306 and/or the array of patterning devices 2 and 3 may have a fixed position to provide the required relative movement.

In an alternative configuration of the embodiment, substrate table 306 may be fixed, with substrate 314 being moveable over substrate table 306. Where this is done, substrate table 306 is provided with a multitude of openings on a flat uppermost surface, gas being fed through the openings to provide a gas cushion which is capable of supporting substrate 314. This is conventionally referred to as an air bearing arrangement. Substrate 314 is moved over substrate table 306 using one or more actuators (not shown), which are capable of accurately positioning substrate 314 with respect to the path of beam 310. Alternatively, substrate 314 may be moved over substrate table 306 by selectively starting and stopping the passage of gas through the openings.

Although lithography apparatus 300 according to the invention is herein described as being for exposing a resist on a substrate, it will be appreciated that the invention is not limited to this use and apparatus 300 may be used to project a patterned projection beam 310 for use in resistless lithography.

In one example, at least one of patterning devices 2 and 3 comprises an array of individually controllable elements. In general, a position of patterning devices 2 and 3 will be fixed relative to projection system 308. However, in other examples, at least one patterning device 2 or 3 may instead be connected to a positioning means for accurately positioning them with respect to projection system 308.

In one example, as shown in FIG. 3, metrology target patterning device 6 comprises an array of individually controllable elements. Target patterning device 6 is connected to a metrology target patterning device controller 10, which is configured to update a pattern represented by the array of individually controllable elements by determining and changing, if necessary, an activation state of each element in the array of individually controllable elements.

In one example, product patterning device 2 comprises a reflective mask 4, which is supported and controlled by a mask table and controller 8.

In one example, product patterning device 2 may also be arranged to comprise an array of individually controllable elements, in which case item 8 would function in a similar fashion to the metrology target patterning device controller 10.

In one or more examples or embodiments, patterning the metrology targets using an array of individually controllable elements, independently from whichever process is used to pattern the product features, allows more efficient updates to be made to the metrology targets without affecting the throughput achieved in the product manufacturing cycle.

It is generally difficult to predict in advance how well a given metrology target will perform in practice. Performance may be improved by fine-tuning the properties of the metrology target, but this would normally require substantial expense and loss of time, particularly if a new reticle set has to be produced for each change of metrology target and if device/product manufacturing processes have to be interrupted and/or delayed in order to carry out these processes. One or more examples or embodiments of the present invention improves the situation by separating the metrology target pattern from the product feature pattern and, particularly where an array of individually controllable elements is used, facilitating the process of changing a metrology target pattern.

Figure 4:
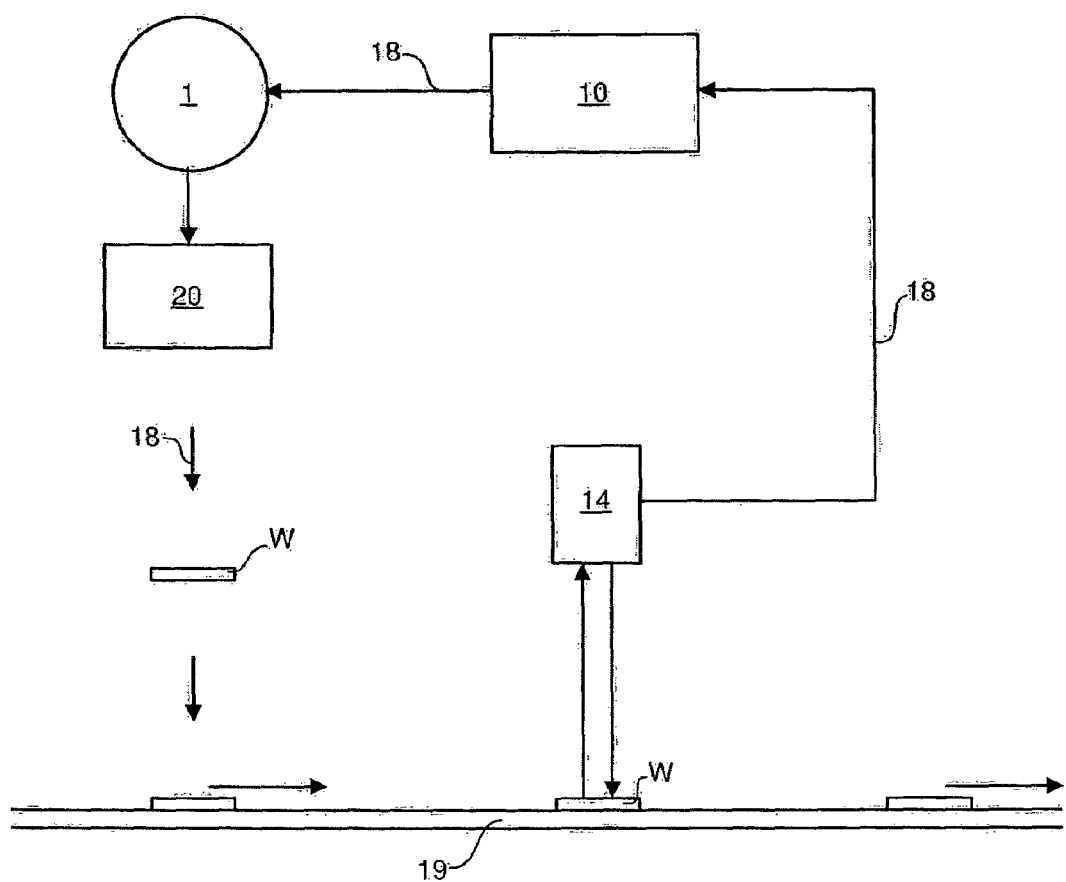
FIG. 4 depicts a metrology target optimizing feedback loop, according to one embodiment of the invention.

FIG. 4 depicts a metrology target optimizing feedback loop, according to one embodiment of the invention. This figure shows an arrangement of a metrology target patterning device controller 10, which is arranged to interact with a feedback loop 18. Lithography apparatus 1, according to one embodiment of the invention, is arranged to print a pattern including at least one metrology target to a substrate W. Patterned substrate W is processed via processing station 20 to develop the metrology target(s) ready for testing. A substrate transportation device 19 is used to carry developed substrates W from processing station 20 to an inspection position to be inspected using a probe 14, which is arranged to test the metrology target performance and send feedback to metrology target patterning device controller 10. Based on information thus received, metrology target patterning device controller 10 calculates a correction to send to lithography apparatus 1 to prompt a change in the pattern imparted to the radiation beam by metrology target patterning device 3.

In this embodiment, substrates developed with the updated metrology target are tested in the same way, and the cycle continues until the performance of the metrology targets falls within predetermined bounds of acceptability. The efficiency of this system allows not only optimization of metrology targets of a standard design type, but, because a larger number of trials are possible, also facilitates broader evaluation of alternative metrology target types.

Exemplary Arrangement of Metrology Targets

Figure 5:
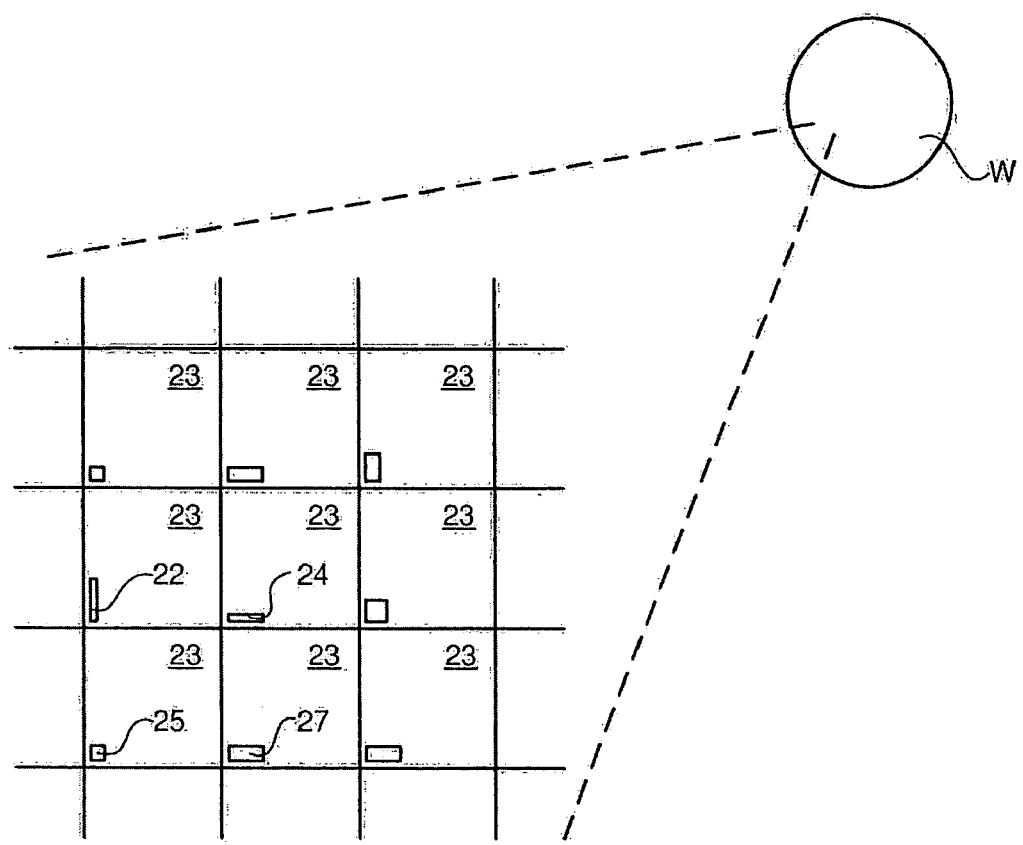
FIG. 5 depicts an arrangement of metrology targets of different types on different target portions of a substrate, according to one embodiment of the invention.

FIG. 5 depicts an arrangement of metrology targets of different types on different target portions of a substrate, according to one embodiment of the invention. In FIG. 5, metrology targets 22, 24, 25 and 27 of different types, which are illustrated schematically in the figure, but may in practice comprise a variety of designs, such as boxes, chevrons, horizontal or vertical gratings, etc., are arranged in different dies 23 on the substrate W.

In one example, metrology targets 22, 24, 25, and 27 may be confined to a metrology target region (e.g., regions 35 and 39 in FIGS. 7 and 8, for example) around a periphery of the substrate W or along scribe lanes between dies.

However, in other examples, metrology targets 22, 24, 25, and 27 may be distributed in a more complex fashion over the surface of the substrate W.

The number and size of metrology targets is limited by space considerations, since they sometimes take up room that might otherwise be used for product features. However, it is desirable that metrology targets be of a certain minimum size and that a plurality of different metrology target designs be printed. In a testing context, for example, to see which locations suffer least from cross-talk, this may be to allow more designs to be evaluated per substrate W. More generally, a number of metrology targets will be required to perform the variety of metrology steps required for accurate lithography. Another reason may be to include metrology target standards from a number of different manufacturers in order to allow different layers to be printed by different machines.

Various embodiments and/or examples of the present invention address the problem of limited space for the metrology targets. For example, a separately controllable metrology target patterning device 3, which allows the metrology target to be easily varied, such as between one die and the next, without changing the pattern imparted by product patterning device 2. High throughput may thus be maintained and, in the case where the metrology target is changed between one die and the next, unnecessary repetition of targets between dies is avoided, thus saving space without reducing the number of metrology targets used. For example, where it is necessary to have separate coarse and fine alignment marks, these may be located in corresponding regions of different dies. In this case, two types of exposure die would exist: a first for printing the product and the fine alignment mark, and a second for printing the product and the coarse alignment mark. The occupied area for the metrology marks is the same in each case and space is therefore saved.

Figure 6:
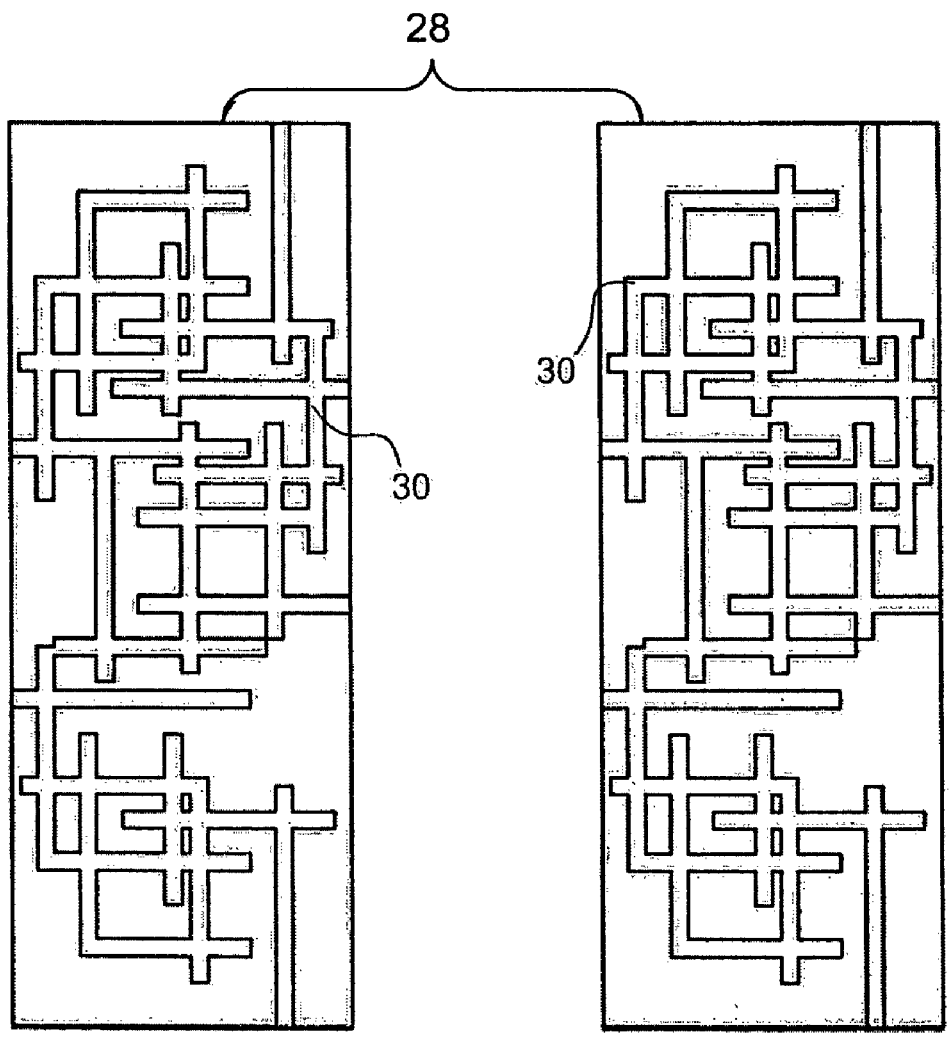
FIG. 6 depicts an example metrology target design comprising a primary structure and a substructure, according to one embodiment of the invention.

FIG. 6 depicts an example metrology target design comprising a primary structure and a substructure, according to one embodiment of the invention. There are various types of metrology targets are likely to be useful. The performance of a given metrology target may be enhanced by including substructure in addition to the primary structure. An example of such an arrangement is shown in FIG. 6, which depicts a grating consisting of vertical lines 28 as a primary structure with a product-like pattern superimposed as a substructure 30. In one example, substructure 30 may be at a relative length scale much smaller than that shown, which is intended for illustrative purposes.

In one example, when the metrology targets are used for alignment, they may be inspected at longer wavelengths than that used to image the product features, so that substructure 30 becomes invisible and does not interfere adversely with the operation of the metrology target as a whole. However, the presence of the product-like features ensures that the metrology targets image in a similar way to the actual product features of the device to be formed and do not suffer from different shifts or errors in the projection system.

Figure 7:
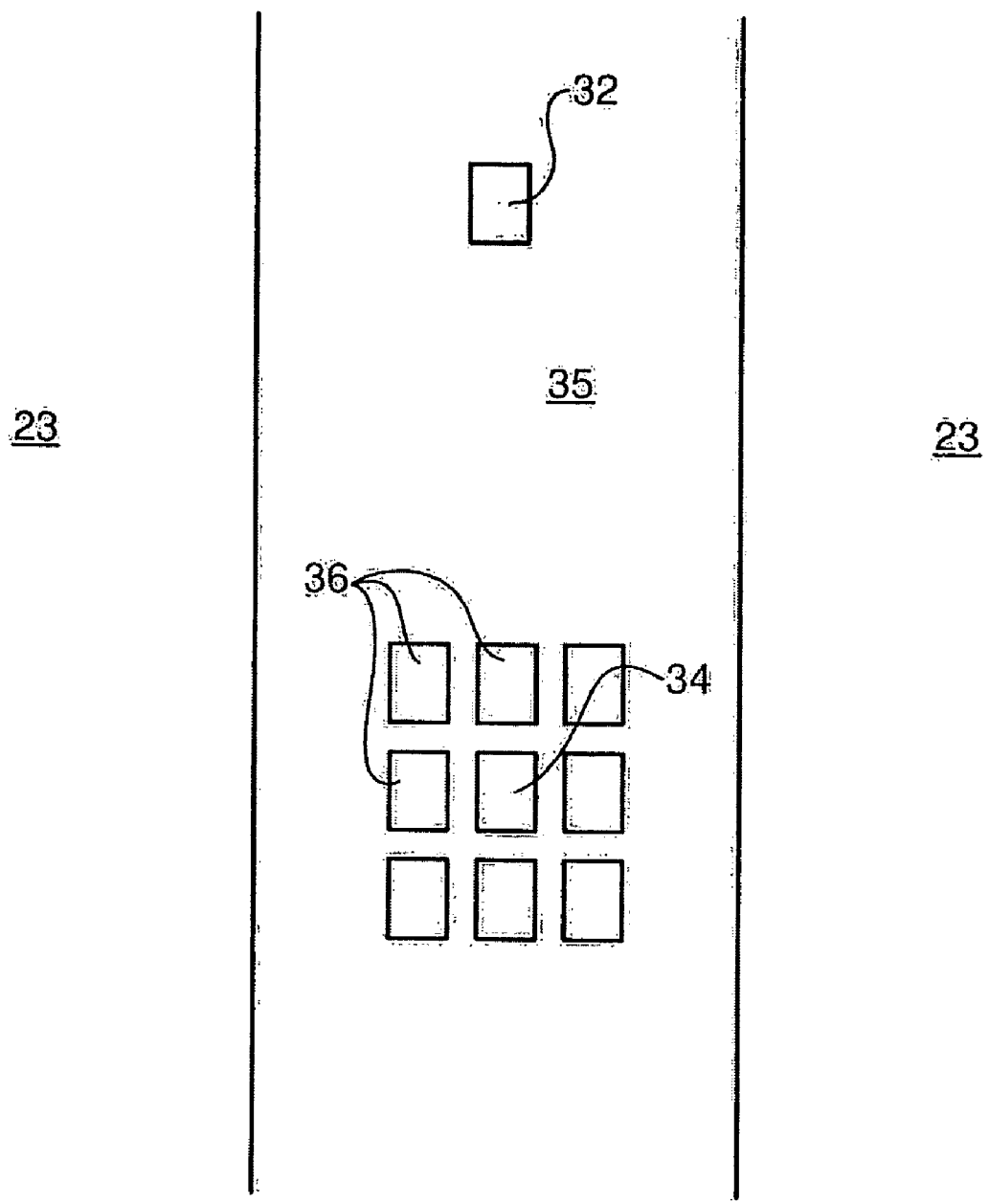
FIG. 7 depicts protective structures for metrology targets positioned in the scribe lane, according to one embodiment of the invention.

FIG. 7 depicts protective structures for metrology targets positioned in the scribe lane, according to one embodiment of the invention. In one example, when metrology targets are positioned in isolated regions of the substrate or in areas with a significantly lower than average density of features, the metrology target may be vulnerable to excessive chemical or mechanical attack. This situation is illustrated in FIG. 7, where a metrology target 32 is isolated in a scribe lane 35 between dies 23. The lower portion of FIG. 7 illustrates how a similar metrology target 34 may be protected, according to one embodiment of the present invention by printing copies of a same metrology target 36 in a configuration surrounding target 34.

Copies of the metrology target are shown in this example because this is an approach that may be favored economically to limit the overhead costs associated with applying protective structures, i.e., no new types of marks need to be made available.

It is to be appreciated that alternative structures may be used, particularly where it is possible to produce such structures without change to the product pattern.

In one example, dedicated protective structures are desired as they can be tailored more extensively to optimize their performance. The dedicated structures may be continuous, for example, rather than island-like, and be arranged to completely surround the metrology target to be protected.

The separation of the metrology target patterning device 3 and the product patterning device 2 allows a variety of configurations to be tested. Parameters that may be important include both the form of the surrounding structures and the separation between those structures and the structures to be protected. A balance may need to be struck between protecting the metrology target and leaving enough space around the metrology target to allow it to perform correctly.

Figure 8:
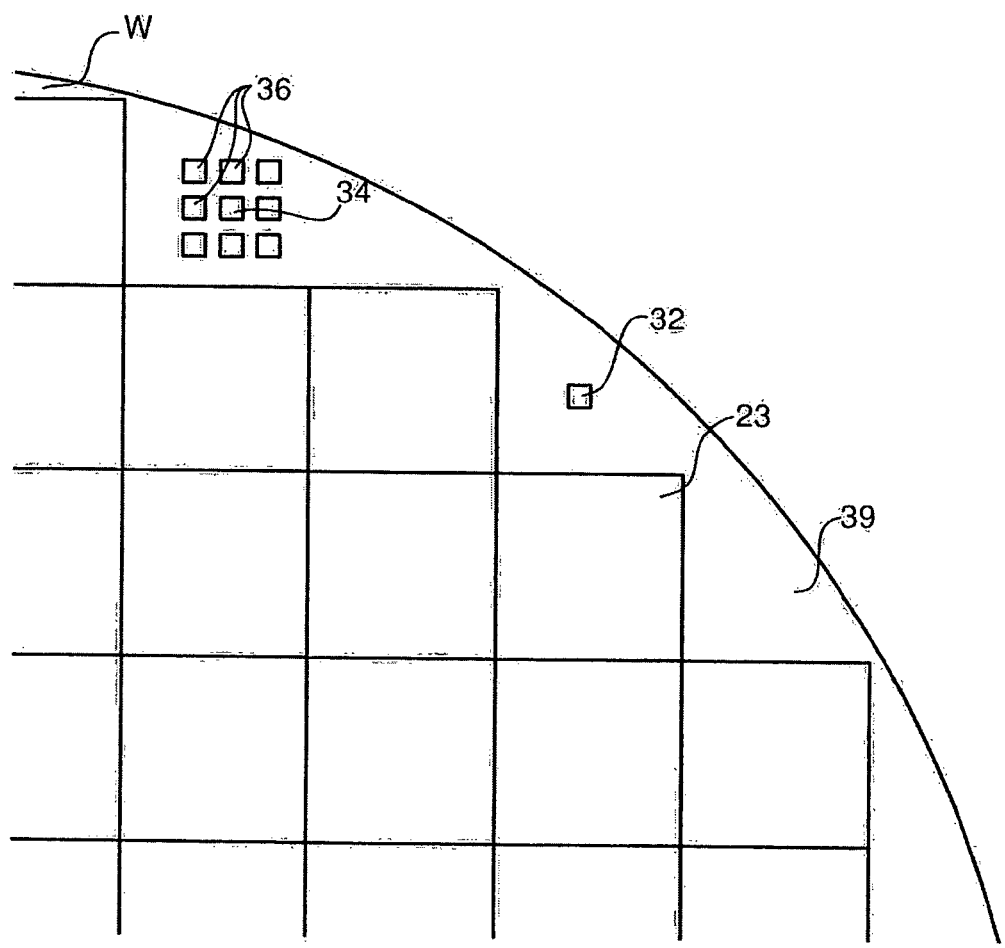
FIG. 8 depicts protective structures for metrology targets positioned in the region between the dies and the edge of the substrate, according to one embodiment of the invention.

FIG. 8 depicts protective structures for metrology targets positioned in the region between the dies and the edge of the substrate, according to one embodiment of the invention. FIG. 8 shows the equivalent arrangement for metrology targets printed in a region 39 around the edge of the substrate outside of dies 23. Again, metrology target 32 is likely to be exposed and vulnerable to attack, while metrology target 34 is protected by clone marks 36.

In one example, although neighboring patterns (either deliberately added protective structures or nearby product features) can serve to protect a metrology target, they can also have a negative impact on performance if cross-talk occurs. It can be difficult to predict where cross-talk of this kind will be a problem.

In one example, a number of different positions for each type of metrology target are tried, and a deduction of which position is more desirable is determined.

In one example, an application is provided (e.g., implemented in software, firmware, or both,) that is arranged to analyze the product pattern and the desired metrology target pattern(s), and determine whether the intended metrology target location is optimal. For example, locations where the nearby product structure is most different to the metrology target are likely to be preferred.

Figure 9:
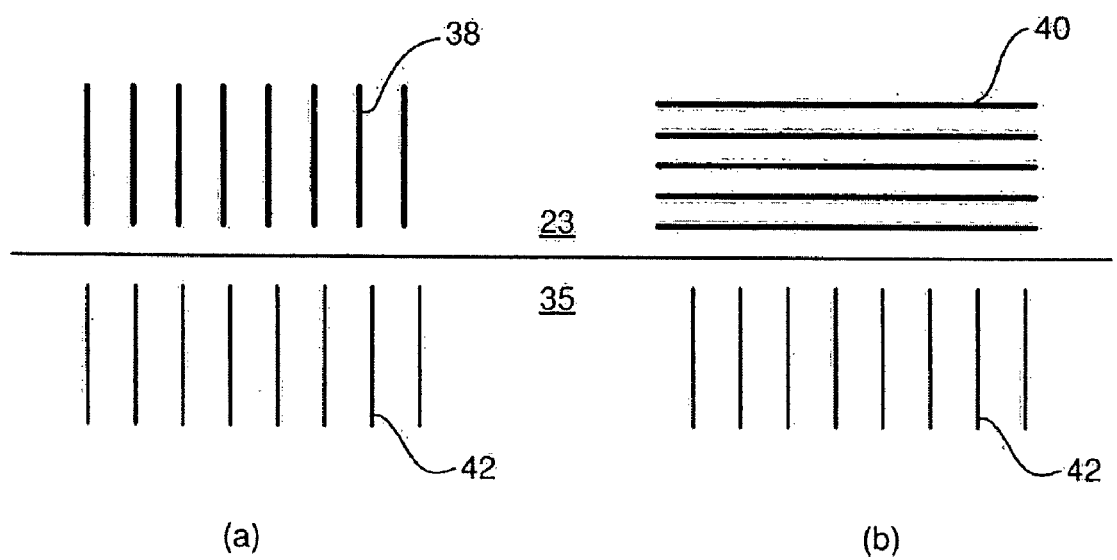
FIG. 9 depicts positioning of metrology targets to minimize cross-talk with product features, according to one embodiment of the invention.

FIG. 9 depicts positioning of metrology targets to minimize cross-talk with product features, according to one embodiment of the invention. FIG. 9 illustrates a simple example of such decision making, which may be built into the metrology target patterning device 3. Here, two product structures, a vertical grating 38 and a horizontal grating 40, are shown near the edge of die 23. Metrology target patterning device 3, taking an input data that includes product structures 38 and 40 (e.g., this maybe derived from the data set sent to the product patterning device 2) will position metrology target 42 at position (b) rather than (a), as the similarly oriented grating 38 is more likely to cause cross-talk effects than grating 40.

Figure 10:
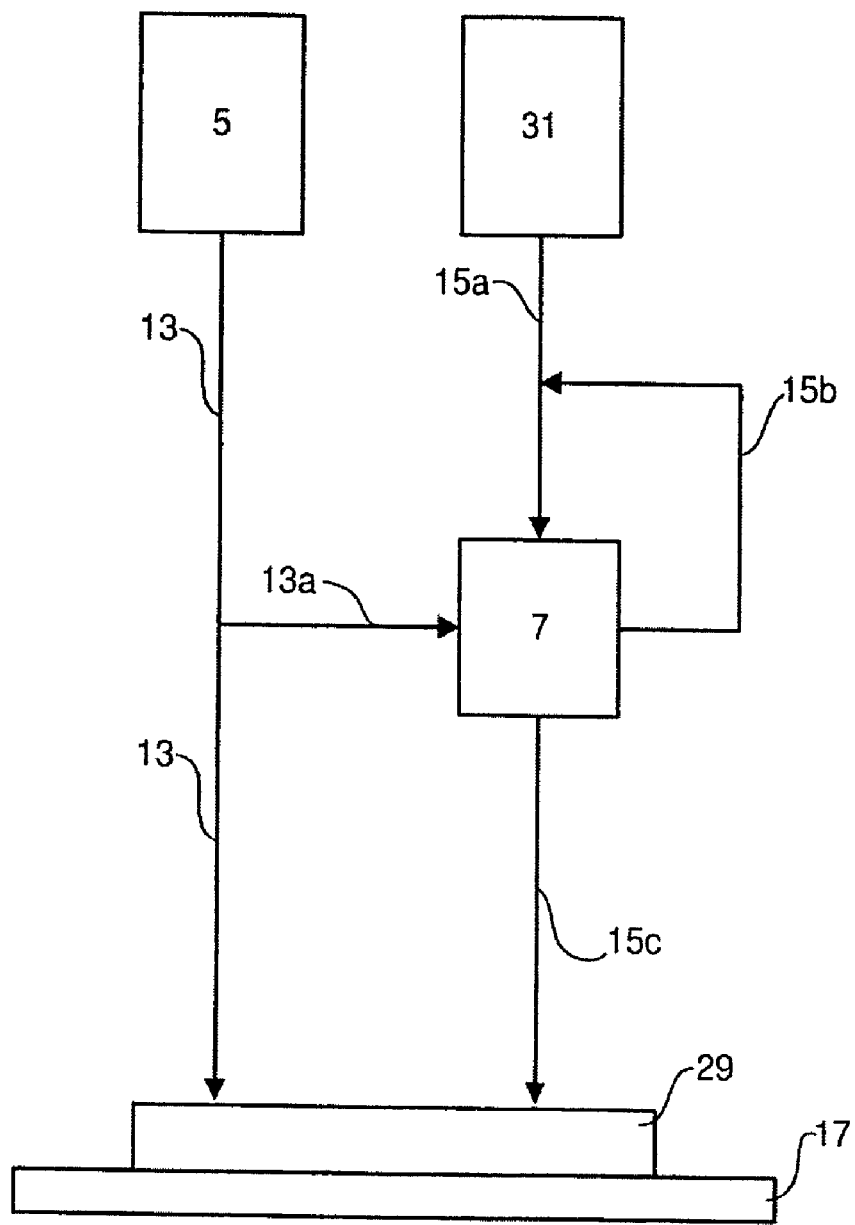
FIG. 10 depicts a lithographic apparatus, according to one embodiment of the invention, comprising a control system for an array of individually controllable elements and a metrology target verification and adaptation device.

FIG. 10 depicts a lithographic apparatus, according to one embodiment of the invention, comprising a control system for an array of individually controllable elements and a metrology target verification and adaptation device. FIG. 10 shows an embodiment according to an alternative aspect of the invention, comprising a single array of individually controllable elements 17 for patterning both product device structures and metrology target structures onto the substrate W. The array of individually controllable elements 17 is controlled by a control system 29, which is capable of actuating each element according to its address and one or more control signals. In this embodiment, control system 29 is configured to receive control signals comprising two separate data streams: a first data stream from a product pattern controller 5 via data path 13, comprising a product pattern data representing features of a product device to be formed and a second data stream via data path 15c comprising metrology target pattern data representing an intended metrology target pattern and/or an intended metrology target location on said substrate.

In this embodiment, although it maybe known what kinds of metrology target are likely to be needed for a given process layer, it may not be clear in advance how best to implement each metrology target for a given product pattern. The separation of the product pattern data from the metrology target pattern data, as described above, allows the implementation of a metrology target verification and adaptation device 7, which is provided to facilitate the introduction of new kinds of metrology target by evaluating a proposed metrology target design and location on the substrate (input, for example, from a metrology target pattern controller 31 via data path 15a) while taking account of the product pattern to be printed (the relevant data being made available via data paths 13a and 15a). If judged necessary, the metrology target verification and adaptation device 7 calculates a suitable correction to either or both of the metrology target pattern or location and sends this correction as a feedback via data path 15b. Once the metrology target verification and adaptation device 7 judges that the likely performance of the metrology target is within acceptable limits, an updated metrology target pattern data is forwarded via data path 15c to control system 29. In this way, the metrology target pattern can be updated in real-time without interrupting the product patterning process. The approach also facilitates the effective introduction of entirely new metrology targets in real time.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
an illumination system configured to provide a radiation beam;
a product patterning device configured to pattern the radiation beam with a product pattern representing features of a product device;
a metrology target patterning device configured to pattern the radiation beam with a metrology target pattern representing at least one metrology target;
a metrology target pattern controller configured to adjust the metrology target pattern independently of said product pattern;
a support structure configured to support the product patterning device and the metrology target patterning device, such that they are separated from each other; and
a projection system configured to project the radiation patterned by said product patterning device and said metrology target patterning device onto a target portion of a substrate;
wherein said metrology target pattern controller adjusts the metrology target pattern after said product pattern has been finalized and prior to the projecting of the radiation patterned by the product patterning device onto the substrate.

2. The lithographic apparatus of claim 1, further comprising:
a mask storage device configured to store a plurality of masks; and
a mask storage device controller configured to provide a selected mask from said mask storage device,
wherein a first one of said product patterning device and said metrology target patterning device comprises at least one of the plurality of masks and a second one comprises an array of individually controllable devices.

3. The lithographic apparatus of claim 1, wherein said metrology target pattern controller provides metrology targets corresponding to at least one predetermined standard.

4. The lithographic apparatus of claim 1, wherein at least one of said product patterning device and said metrology target patterning device comprises an array of individually controllable elements.

5. The lithographic apparatus of claim 1, wherein said metrology target pattern controller adjusts said metrology target based on information derived from inspection of a previously patterned substrate.

6. The lithographic apparatus of claim 1, wherein said metrology target patterning device patterns the radiation beam corresponding to a metrology target and a pattern corresponding to a protective structure for said metrology target.

7. The lithographic apparatus of claim 1, wherein said metrology target pattern controller provides a metrology target pattern comprising a plurality of metrology targets.

8. The lithographic apparatus of claim 1, wherein said at least one metrology target comprises a primary structure and at least one substructure.

9. The lithographic apparatus of claim 5, further comprising:
a metrology target inspection device configured to inspect the previously patterned substrate to provide said information to said metrology target pattern controller.

10. The lithographic apparatus of claim 6, wherein said protective structure comprises at least one copy of said metrology target.

11. The lithographic apparatus of claim 7, wherein two or more of said plurality of metrology targets are positioned in different target portions on said substrate.

12. The lithographic apparatus of claim 11, wherein said different target portions comprise different dies.

13. The lithographic apparatus of claim 8, wherein said substructure has a form different to that of said primary structure.

14. The lithographic apparatus of claim 8, wherein said substructure has a characteristic length scale smaller than that of said primary structure.

15. The lithographic apparatus of claim 8, wherein said primary structure comprises a grating.

16. A lithographic apparatus, comprising:
an illumination system configured to supply a beam of radiation;
a control system configured to control an array of individually controllable elements to pattern the beam;
a projection system configured to project the patterned beam onto a target portion of a substrate,
wherein said control system receives a first data file comprising product pattern data representing features of a product device to be formed, and
wherein said control system receives a second data file comprising metrology target data representing a metrology target pattern and an intended metrology target location on the substrate
wherein the control system modifies the second data file after receiving the first data file and prior to the projecting of the patterned beam onto the target portion of the substrate.

17. The lithographic apparatus of claim 16, further comprising:
a metrology target verification and adaptation device configured to detect performance of a metrology target based on an analysis of product pattern data and metrology target data.

18. The lithographic apparatus of claim 16 further comprising:
a metrology target verification and adaptation device configured to adjust said metrology target data to provide an improved metrology target based on a detected performance.

* * * * *